July 8, 1969 L. J. COLEMAN ET AL 3,454,921

ELECTRONIC COMPONENT CARRIER

Filed Oct. 23, 1965

WITNESSES

Theodore F. Wrobel

James F. Young

INVENTORS
Louis J. Coleman
& Leslie Sut Fong Chin
BY
Gordon H. Telfer
ATTORNEY

United States Patent Office 3,454,921

Patented July 8, 1969

3,454,921

ELECTRONIC COMPONENT CARRIER

Louis J. Coleman, Ellicott City, and Leslie Sut Fong Chin, Baltimore, Md., assignors to Westinghouse Electric Corporation, Pittsburgh, Pa., a corporation of Pennsylvania Filed Oct. 23, 1965, Ser. No. 503,992

Int. Cl. H01r *13/46;* H05k *1/00*

U.S. Cl. 339—174 9 Claims

ABSTRACT OF THE DISCLOSURE

The carriers described, such as for flat packaged integrated circuits, include a base member having a recess and groove configuration for positioning the package and leads of the component. A cover, removably secured to the base, ensures retention of the component but may have open portions providing access to the component leads for electrical testing. The elements of the carrier are asymmetrically designed to facilitate manual or automatic handling and testing of components.

Figures 1, 2:
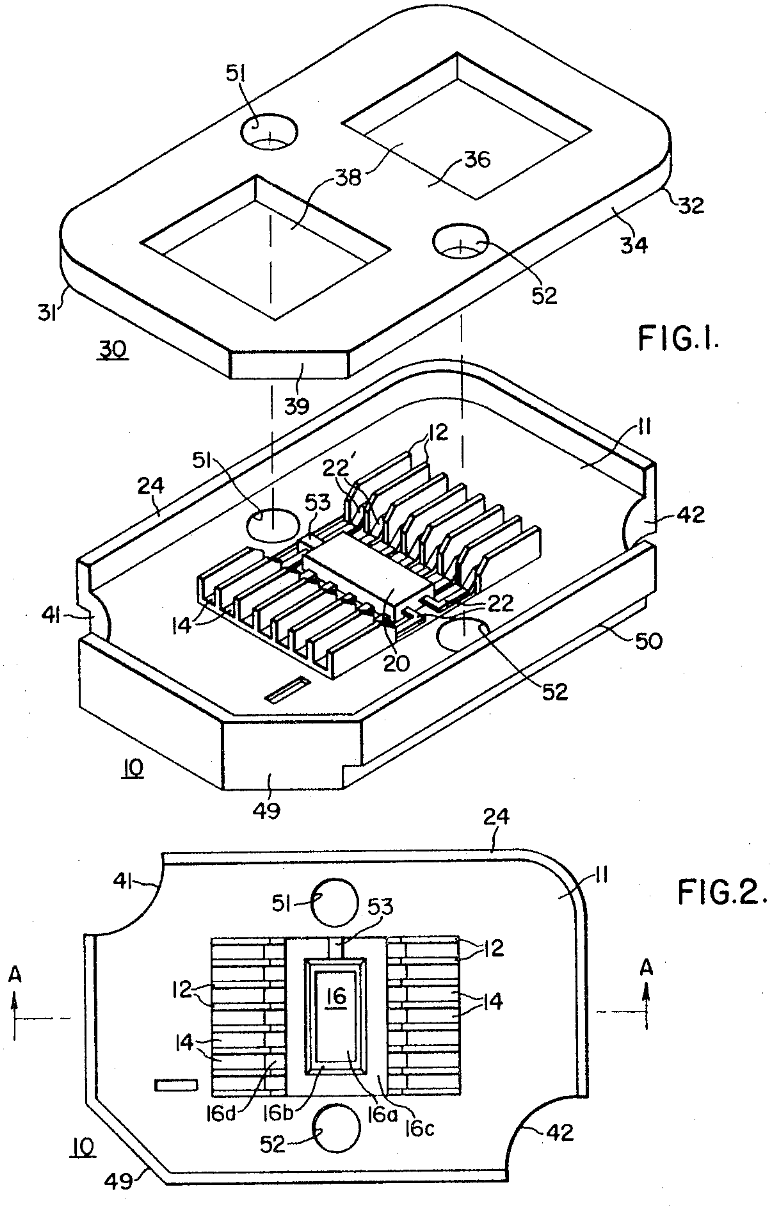

This application relates to apparatus for facilitating the handling, testing and use of electronic components, particularly electronic components housed in flat packages with laterally extending leads such as semiconductor integrated circuits.

Electronic components such as semiconductor integrated circuits are often packaged within a flat enclosure having leads laterally extending therefrom. This is a configuration that provides efficient use of volume and permits a relatively large number of leads, typically up to 14, from a flat enclosure of about ¼ by ⅛ inch in major surface dimensions. In its end use application, the electronic component is usually permanently mounted, such as by soldering the leads to a printed circuit board or some other substrate. However, between initially enclosing the component in the flat package and permanently mounting it in its end use environment, it is subjected to a great amount of handling. The requisite handling is for testing, sorting and other operations incurred in manufacturing and passing the component through distribution channels to its ultimate location.

Both manufacturers and users of large numbers of small electronic components expend considerable time and expense in handling, testing and sorting operations. Such operations must presently be substantially performed by hand. A considerable number of errors and possible damage to the component may occur.

In copending application Ser. No. 384,081, filed July 21, 1964, by L. J. Coleman and assigned to the assignee of the present invention, now Patent 3,319,166 issued May 9, 1967 there is disclosed a test fixture for flat packaged electronic components that is highly useful as a carrier during the electrical testing of components such as semiconductor integrated circuits. However, the apparatus described therein is not well suited for other handling and testing operations, it is not well suited to automatic handling and it is not as inexpensive and lightweight as is desired.

It is, therefore, an object of the present invention to provide an improved carrier for bat packaged electronic components to facilitate their handling, testing and use by manufacturer, shipper and user.

Another object is to provide a carrier for flat packaged electronic components that facilitates handling and testing either by hand operations or automatic equipment.

Another object is to provide a carrier that permits testing an electronic component both mechanically and electrically.

Another object is to provide a carrier for flat packaged electronic components that is inexpensive and lightweight.

The above-mentioned and additional objects and advantages of the prevent invention are achieved by an electronic component carrier including a base member and a cover member. The base member has a plurality of projections extending from a first surface that define a plurality of grooves for the leads of the electronic component to be contained. The base member also has a recess within the surface for receiving the electronic component enclosure and supporting it in place. The cover member is removably secured to the base member in a position over the surface having the grooves and recess in it. The cover member has a solid portion disposed over the recess for retaining the electronic component. For electrical testing, the cover has an open portion over the grooves for permitting access to the leads contained therein.

In accordance with other features of the invention, it is preferred that all parts of the carrier be of electrically insulating material. Also, the periphery of the recess slopes from the surface providing positive support for leads positioned in the grooves in the event that the leads are of a non-planar configuration.

The base and cover are asymmetrically designed so that a component can be inserted into the base in only one orientation, the cover can be applied to the base in only one orientation and the assembled combination can be readily positioned, manually or by machine, in a single preferred orientation for testing or use.

Figure 3:
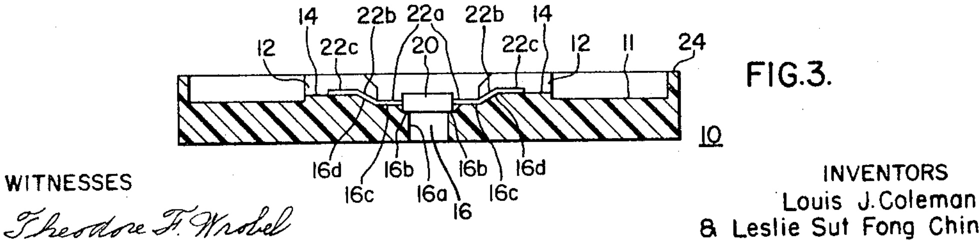

The above-mentioned and additional objects and advantages of the present invention will be better understood by referring to the following description, taken with the accompanying drawing, wherein:

FGURE 1 is an exploded, perspective view of an electronic component carrier in accordance with this invention with a flat packaged electronic component contained therein;

FIG. 2 is a plan view of the base member of the carrier of FIG. 1 without an electronic component in place; and FIG. 3 is a sectional view taken along the line A—A' of FIG. 2 with an electronic component in place.

Referring to the drawing, a carrier in accordance with this invention comprises a base member 10 and a cover member 30. The base member 10 has an overall configuration approximating that of a rectangular parallelopipe with major surfaces of substantially greater dimension than the thickness. The generally flat and rectangular configuration allows obstructionless removal of an individual carrier from a voltage stack or horizontal array and also facilitates the carriers use as a shipping container.

On one major surface 11, there are a plurality of projections 12 that define a plurality of grooves 14 for receiving the leads of an electronic component to be contained by the carrier. A recess 16 is disposed within the groove pattern for positioning the enclosure of the electronic component.

In this example, the recess and groove configuration is for a component in a package of which the enclosure 20 has dimensions of about ¼ by ⅛ inch, a popular size for semiconductor integrated circuits. The example package has fourteen leads 22 of which five extend from each of the long sides of the enclosure and two extend from each of the short sides. The latter have a right angle bend which effectively form seven leads on each side of the package in a row.

The recess 16 in the base member 10 in this example, best shown in FIGS. 2 and 3, is in a succession of stages. At the bottom is an aperture **16*a*** entirely through the base member primarily to permit visual inspection in the recess to determine if a component is contained therein and to read any identification on the package.

The other stages of the recess 16 are for support of the component enclosure and leads of the device that may have a non-planar configuration as shown. Such a lead configuration is sometimes preferred for ease of joining the component to printed circuit boards or the like in the final application of the component. In this example, the component enclosure 20 rests on a shoulder 16_b_. A first portion of the lead 22_a_ extends straight out in the plane of the package and rests on a shoulder 16_c_ in the carrier. A second lead portion 22_b_ gradually slopes upward and rests on a sloping portion 16_d_ of the recess. A final lead portion 22_c_ again extends in a parallel plane with the package, and rests on surface 11 within groove 14.

While the basic purposes of the carrier may be otherwise achieved, it is preferred that the groove and recess configuration for maximum protection be such as to fully support all portions of the component leads. In making electrical contact to the leads by probes or other means substantial pressure may be applied without endangering the leads since they are fully supported. Packages with flat leads about 12 mils wide and 4 mils thick of Kovar alloy are commonly used for integrated circuits.

The base member 10 includes means for removably securing the cover member 20 thereto. This is achieved in this example by the wall 24 extending around most of the periphery of the first surface 11 of the base member within which the cover 20 fits securely but from which it may be readily removed. Two corners 31 and 32 of the cover extend over the periphery of the surface 11 of the base because of the scalloped portions 41 and 42 of the base member.

The cover includes a peripheral portion 34 that fits against the retaining wall 24 of the base member 10 and also a closed portion 36 disposed in a position over the recess 16 in the base member for retaining an electronic component therein. Additionally, the cover has openings 38 positioned over the groove pattern in the base member to permit access to leads disposed in these grooves 14.

An electronic component contained within the carrier may be readily electrically tested by inserting probes or the like through the openings 38 in the cover and into the base grooves. It is of course preferred that the projections 12 and all portions of the structure that come into contact with the package and leads be of good electrically insulating material. Conveniently, all parts of the base 10 and cover 30 may be, and preferably are, of insulating material. The grooves positively retain the leads of the component in position so that it is very unlikely that they will be damaged or distorted during testing or handling.

Besides electrical tests, the component in the carrier may be subjected to mechanical testing such as centrifuging, vibration and shock testing in which instance it may be preferred that the cover be substantially continuous, that is, without the open portions 38 thereof.

The base and cover are designed so that a component can be inserted in the base 10 correctly in only one way, so that leads can be positively identified merely by their position in the carrier. Also, the cover 30 can be placed on the base in only one way so that any nomenclature on the cover need only be on one surface. Additionally, the base 10 has a configuration so that in handling the assembly a unique orientation can be readily achieved.

For these purposes, the base and cover members 10 and 30 are asymmetrically designed. As illustrated, they have a corner removed forming edge surfaces 39 and 49 on the cover and base, respectively, so that the position of that corner requires positioning the cover in only one way and uniquely determines the orientation of the assembly. Also, in this example, the base member 10 has a stepped portion 50 in one edge to assist in positioning it. This effectively allows only one tracking orientation determined by the edge 50. Additionally, both cover and base have matching holes 51 and 52 positioned therethrough. The holes 51 have a diameter different than that of holes 52. These features in various simple combinations not only assist in rapid manual orientation of the structure so that in inserting a test probe connections to the proper leads may be insured but it also greatly facilitates handling and orientation of the assembly by automatic machinery. This combination of bevels, strips and grooves allows both vertical stacking and horizontal tracking with escapement provisions.

To ensure proper placement of a flat packaged component within the carrier, a boss 53 is positioned on the surface 11 at one edge of the recess 16. The leads 22 are designed so that in only a single orientation may they be inserted properly in the carrier without being blocked by the boss 53.

While the unique positioning of a component in the carrier fixes the identity of each lead, it is convenient to provide a further visual indication as by placing a mark adjacent a particular lead position on an exposed portion of the base or cover.

In the illustrated example, the surface within the grooves 14 is not quite coplanar with that of the peripheral portion of surface 11. However, this is merely for design convenience. The surface of the grooves 14 may be coplanar or even below the remainder of surface 11.

Carriers have been made substantially as shown for variety of integrated circuit package sizes. A large number of plastic materials are suitable for forming the carrier members, including members of the allylic resin family of materials, that can be readily molded to adequate dimensional tolerances, that have adequate electrical insulating properties, and produce a lightweight and relatively inexpensive carrier.

Among the many possible modifications within the scope of this invention are the provision of grooves in the cover member matching the grooves 14 in the base member 10 for further insurance of proper lead positioning. However, these are not considered necessary and it is preferred to use the illustrated configuration to enable the use of a one-piece proble guide for electrical testing.

The configuration of the carrier is such that it may uniquely fit in machinery for sorting and indexing and to avoid or minimize manual operations. It is also possible to apply some identification directly to the package or to the carrier in which the package is diposed so that the component can be automatically identified either magnetically or optically. Further, mechanization of loading and unloading components from the carriers may be achieved by magnetic or pneumatic means.

The symmetrically arranged scalloped portions 41 and 42 on the base member 10 facilitate removal of the cover 30 merely by inserting the carrier over obstructions, such as a pair of posts that fit in the scalloped portions. A manual method is by lifting the corner in scallop 42 which is possible because of bevel 49.

Carriers in accordance with this invention also permit leak testing as they are able to withstand rough handling and gas has access to the component package. The molded plastic materials preferred for the carrier are readily able to withstand the atmospheres and temperatures encountered.

Another advantageous feature of the carrier is that while preserving the overall configuration that permits machine indexing and rapid handling, the internal groove and recess configuration may be varied for any of a variety of flat packages.

The carrier, with a component in it, can be attached directly on substrates by mechanical interconnection while preserving interchargeability and ease of replacement for ease of maintenance or prototype circuitry development.

While the invention has been shown and described in a few forms only, it will be apparent that various modifications may be made without departing from the spirit and scope thereof.

What is claimed is:

1. A carrier for containing an electronic component in a flat package having laterally extending leads comprising: a base member having a first surface; a plurality of projections extending from said surface defining a plurality of grooves for leads of an electronic component to be contained; a recess within said surface for receiving the electronic component to be contained; a cover member; means for removably securing said cover member to said base member in a position over said first surface; said cover member having a solid portion so that when said cover member is secured to said base member said solid portion is disposed over said recess for retaining and supporting said electronic component therein; said cover member also having an open portion so that when said cover member is secured to said base member said open portion is over said grooves for permitting access to leads contained therein.

2. The carrier of claim 1 wherein: at least said projections are of electrically insulating material.

3. The carrier of claim 1 wherein: the periphery of said recess has a portion sloping from said surface to provide positive support for leads positioned in said grooves.

4. The carrier of claim 1 wherein: another projection extends from said surface at the periphery of said recess for assisting in proper location of said electronic component therein.

5. The carrier of claim 1 wherein: said base member has an asymmetrical configuration for permitting rapid orientation of the carrier in any direction.

6. The carrier of claim 1 wherein: said cover member when secured to said base member extends beyond the periphery of said first surface for facilitating removal from said base member.

7. The carrier of claim 1 wherein: said means for removably securing said cover member to said base member includes a wall extending from said surface at the periphery thereof.

8. The carrier of claim 1 wherein: said base member including said projections and said wall is an integrat body of insulating material.

9. A carrier for containing a flat packaged electronic component, such as a semiconductor integrated circuit, to facilitate the handling, testing and final application of the component, said carrier comprising:

a base having a configuration approximating that of a rectangular parallelopiped with major surface dimensions substantially greater than the thickness thereof; said base including a peripherally positioned wall portion extending about a portion of one of said major surfaces; a cover member shaped to fit and be retained within said wall and extending beyond the periphery of a portion of said major surface to facilitate removal of said cover when desired; said base and said cover both having an asymmetrical configuration to permit rapid orientation of said carrier; a plurality of projections extending from said one major surface defining a plurality of grooves for leads of an electronic component; a recess within said one major surface for receiving said electronic component; said base having an aperture extending from said recess to the other of said major surfaces to facilitate identification of the electronic component contained therein; said cover having a closed portion positioned over said recess to retain a component therein and an open portion positioned over said grooves to permit access to leads positioned therein.

References Cited

UNITED STATES PATENTS

| | | | |
|---|---|---|---|
| D. 202,937 | 11/1965 | Foshee et al. | |
| 3,293,590 | 12/1966 | Woolsey | 339—192 |
| 1,940,942 | 12/1933 | Dohrwardt | 339—150 X |
| 3,118,016 | 1/1964 | Stephenson. | |
| 3,267,335 | 8/1966 | Walkow. | |
| 3,297,974 | 1/1967 | Pittman. | |

FOREIGN PATENTS

| | | |
|---|---|---|
| 698,082 | 1/1931 | France. |

MARVIN A. CHAMPION, *Primary Examiner.*

U.S. Cl. X.R.

324—158; 339—17